US012660635B2

(12) United States Patent
Loiseau et al.

(10) Patent No.: US 12,660,635 B2
(45) Date of Patent: Jun. 16, 2026

(54) MACHINE-READABLE CODE IN INTEGRATED CIRCUIT

(71) Applicant: GlobalFoundries U.S. Inc., Malta, NY (US)

(72) Inventors: Alain F. Loiseau, Williston, VT (US); Romain H.A. Feuillette, Williston, VT (US); Mujahid Muhammad, Essex Junction, VT (US); Peter T. Coutu, Williston, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 380 days.

(21) Appl. No.: 18/341,893

(22) Filed: Jun. 27, 2023

(65) Prior Publication Data

US 2025/0006650 A1     Jan. 2, 2025

(51) Int. Cl.
H10W 46/00          (2026.01)
G01R 31/28          (2006.01)
H10W 20/42          (2026.01)

(52) U.S. Cl.
CPC ........ H10W 46/00 (2026.01); G01R 31/2887 (2013.01); H10W 20/42 (2026.01); H10W 46/106 (2026.01)

(58) Field of Classification Search
CPC ............... H01L 23/544; H01L 23/5226; H01L 2223/54413; G01R 31/2887; H10W 46/00; H10W 46/106; H10W 20/42
USPC .......................................................... 438/17
See application file for complete search history.

(56) References Cited

U.S. PATENT DOCUMENTS

| | | | |
|---|---|---|---|
| 6,557,244 B1 * | 5/2003 | Yang | ................. H01L 21/67236 |
| | | | 29/34 R |
| 6,888,159 B2 | 5/2005 | Farnworth et al. | |
| 9,613,912 B2 | 4/2017 | Scanlan | |
| 10,229,886 B2 | 3/2019 | Yu et al. | |
| 10,242,951 B1 | 3/2019 | Piper | |
| 10,373,913 B2 | 8/2019 | Scanlan | |
| 10,528,942 B2 | 1/2020 | Purves | |
| 10,552,621 B2 | 2/2020 | Smith et al. | |

(Continued)

OTHER PUBLICATIONS

Office Action from U.S. Appl. No. 18/463,668 dated Jun. 23, 2025, 15 pages.

(Continued)

*Primary Examiner* — Tu-Tu V Ho

(74) *Attorney, Agent, or Firm* — Jessie Cheah; Hoffman Warnick LLC

(57) ABSTRACT

An integrated circuit (IC) includes a plurality of metal layers, and a machine-readable code in a selected metal layer of the plurality of metal layers. A wafer includes a plurality of the ICs. An IC wafer testing system includes a scanner configured to read the machine-readable code in the metal layer of the IC in the wafer, and a tester configured to perform testing on the IC in the wafer based on testing information obtained from storage based on the machine-readable code. A method may include forming the IC including a plurality of metal layers and forming a selected metal layer of the IC including the machine-readable code in metal in the selected metal layer. The method may further include testing the IC. The machine-readable code reduces the complexity and time needed to setup and test an IC in a wafer.

20 Claims, 9 Drawing Sheets

(56) References Cited

U.S. PATENT DOCUMENTS

| | | | |
|---|---|---|---|
| 2005/0067491 A1 | 3/2005 | Ishikawa et al. | |
| 2006/0175401 A1 | 8/2006 | Roberts | |
| 2011/0156033 A1 | 6/2011 | Bintang et al. | |
| 2014/0232017 A1 | 8/2014 | Rampley et al. | |
| 2016/0064296 A1* | 3/2016 | Suzumura | H01L 22/34 |
| | | | 438/4 |
| 2016/0351508 A1 | 12/2016 | Kalyanaraman et al. | |
| 2018/0269091 A1* | 9/2018 | Ophir | H01L 21/67294 |
| 2020/0065826 A1 | 2/2020 | Gering et al. | |
| 2021/0057232 A1 | 2/2021 | Pio | |
| 2022/0123939 A1 | 4/2022 | Guinard et al. | |
| 2022/0358673 A1 | 11/2022 | Patel et al. | |
| 2023/0419255 A1 | 12/2023 | Xiu et al. | |
| 2024/0095483 A1 | 3/2024 | Liu | |
| 2025/0086657 A1 | 3/2025 | Coutu et al. | |

OTHER PUBLICATIONS

QR Code Laser Marking of Silicon Wafer, Potomac The Leader in Digital & Micro Fabrication, Feb. 6, 2011, 3 pages.

Markman et al., "Photon-Counting Security Tagging and Verification Using Optically Encoded QR Codes," IEEE Photonics Journal, vol. 6, No. 1, 6800609, Feb. 2014, 10 pages.

Batista et al., "QR Code micro-certified gemstones: femtosecond writing and Raman characterization in Diamond, Ruby and Sapphire," Scientific Reports, 9:8927, 2019, 7 pages.

Htt Group, Wafer Code Readers, https://www.httgroup.eu/en/wafer_reader/, 5 pages.

Mirchandani and Kashyap, "Blockchain in the Semiconductor Industry: 5 Innovative Use Cases Gaining Traction," Manufacturing Leadership Council Insights, Jan. 13, 2022, 12 pages.

U.S. Appl. No. 18/463,668, Amendment to Office Action filed Sep. 22, 2025, 12 pages.

U.S. Appl. No. 18/463,668, Notice of Allowance dated Nov. 25, 2025, 15 pages.

U. Guin, "Robust, Low-Cost, and Accurate Detection of Recycled Integrated Circuits (ICs) Using Digital Signatures," AFRL-RY-WP-TR-2022-0174, Final Report, Jul. 2022, 44 pages.

M. Tehranipoor et al., Chip ID, Counterfeit Integrated Circuits: Detection and Avoidance, Cham: Springer International Publishing, 2015, pp. 243-263, (Year: 2021).

Vashistha et al., "eChain: A Blockchain-Enabled Ecosystem for Electronic Device Authenticity Verification," IEEE Transactions on Consumer Electronics, vol. 68, No. 1, Feb. 2022, 15 pages.

J.D. Evans, "Improving the Transparency of the Pharmaceutical Supply Chain Through the Adoption of Quick Response (QR) Code, Internet of Things (IoT), and Blockchain Technology: One Result: Ending the Opioid Crisis," Journal of Technology Law & Policy, vol. XIX, 2018-2019, DOI 10.5195/tlp.2019.227, 20 pages.

Xu et al., "Electronics Supply Chain Integrity Enabled by Blockchain," ACM Transactions on Design Automation of Electronic Systems, vol. 24, No. 3, Article 31, Published May 2019, 25 pages.

* cited by examiner

140

140

140

140

140

MACHINE-READABLE CODE IN INTEGRATED CIRCUIT

BACKGROUND

The present disclosure relates to integrated circuits and, more particularly, to an integrated circuit (IC) having a machine-readable code embedded therein for use during testing.

Integrated circuits undergo testing to ensure operability. The testing process has a number of time-consuming steps. For example, a wafer including a plurality of ICs must be aligned in a testing system, the physical test structures (macros) on each IC must be located, and information regarding the test structures and tests to be performed on each IC must be retrieved from data storage. Retrieving testing information typically includes manually reading a human-readable code, e.g., an alphanumeric label, formed on the IC and using the code to retrieve information about the testing to be performed, such as test structures present on the IC. In some testing systems, the wafer alignment can be performed automatically, but it is oftentimes conducted manually. Locating the alphanumeric labels and test structures on an IC is also performed manually by, for example, looking at maps and test structure names.

SUMMARY

All aspects, examples and features mentioned below can be combined in any technically possible way.

An aspect of the disclosure provides an integrated circuit (IC), comprising: a plurality of metal layers; and a machine-readable code in a selected metal layer of the plurality of metal layers.

An aspect of the disclosure provides an integrated circuit wafer testing system, comprising: a scanner configured to read a machine-readable code in a metal layer of an integrated circuit in a wafer; and a tester configured to perform testing on the IC in the wafer based on testing information obtained from storage based on the machine-readable code.

An aspect of the disclosure provides a method, comprising: forming an integrated circuit (IC) including a plurality of metal layers; and forming a selected metal layer of the IC including a machine-readable code in metal in the selected metal layer.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
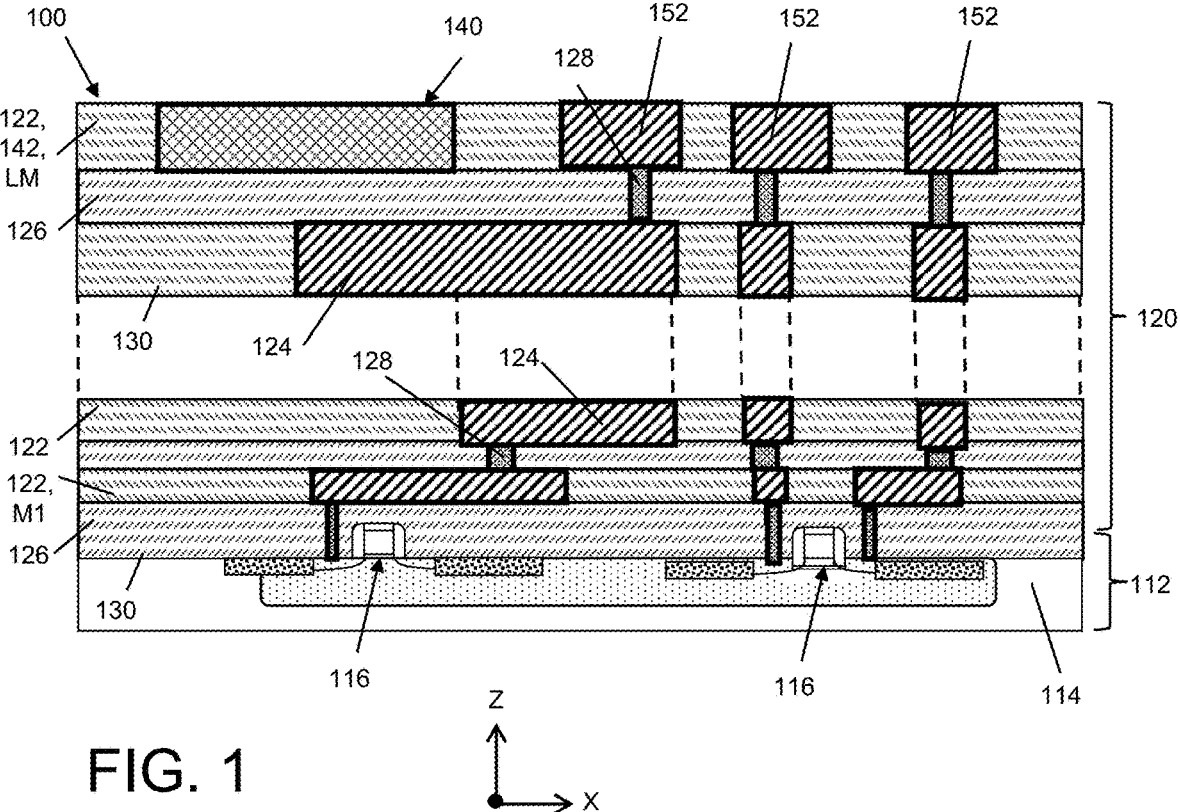
FIG. 1 shows a cross-sectional view of an integrated circuit including a machine-readable code in a selected metal layer, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include an integrated circuit (IC) including a plurality of metal layers; and a machine-readable code in a selected metal layer of the plurality of metal layers. A wafer including a plurality of the ICs is also provided. An integrated circuit wafer testing system includes a scanner configured to read the machine-readable code in the metal layer of the IC in the wafer, and a tester configured to perform testing on the IC in the wafer based on testing information obtained from storage based on the machine-readable code. A method may include forming the IC including a plurality of metal layers and forming a selected metal layer of the IC including the machine-readable code in metal in the selected metal layer. The method may further include testing the IC. The machine-readable code reduces the complexity and time needed to setup IC testing in a wafer. The machine-readable code also takes up less space compared to currently used alphanumeric labels and eliminates illegible alphanumeric labels.

Figure 2:
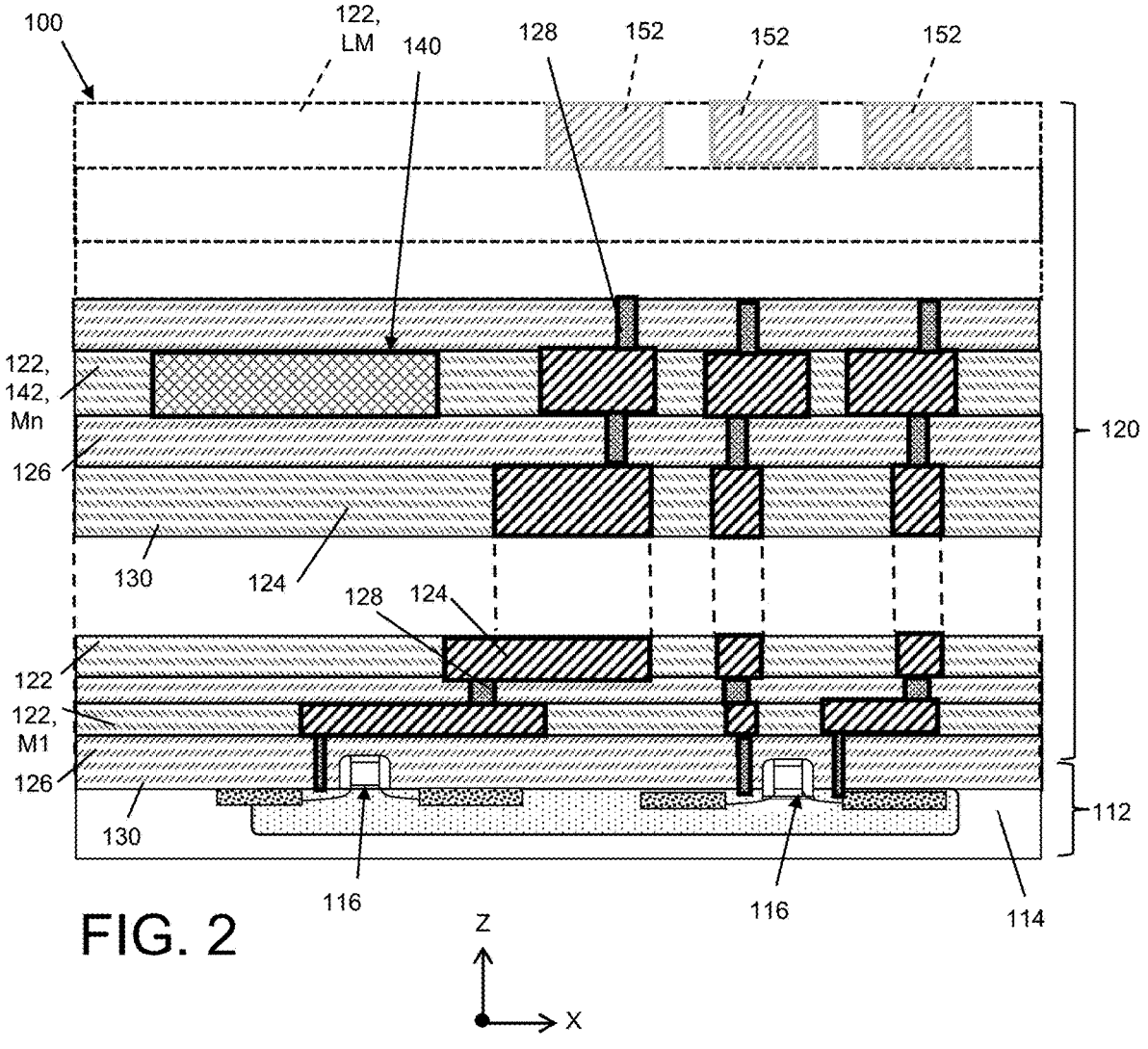
FIG. 2 shows a cross-sectional view of an integrated circuit including a machine-readable code in a selected metal layer, according to other embodiments of the disclosure.

FIGS. 1 and 2 show cross-sectional views of an IC 100 including a machine-readable code 140, according to embodiments of the disclosure. IC 100 may include any now known or later developed integrated circuit. For example, IC 100 includes a device layer 112 including any now known or later developed integrated circuit devices, e.g., transistors. Device layer 112 may include a substrate 114, such as a bulk semiconductor or a semiconductor-on-insulator substrate. Devices, such as transistors 116 may be formed in or on substrate 114. A plurality of interconnect layers 120 may be over device layer 112 to scale electrical connections to device layer 112. Interconnect layers 120 may include a plurality of metal layers 122 that include horizontally extending metal wires 124 (across, into and out of page), and a plurality of via layers 126 including vertically extending contacts or vias 128 (hereinafter "contacts 128"). As understood in the art, contacts 128 electrically couple metal wires 124 in adjacent metal layers 122. Metal wires 124 and contacts 128 are formed in interlayer dielectric (ILD) layers 130. ILD layers 130 may include suitable dielectric materials including but not limited to: silicon oxide materials; carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Other ILD layers 130 may also be possible.

In the structures and methods described above, contacts 128 in interconnect layers 120 can be, for example, tungsten contacts, cobalt contacts or contacts made with any other suitable contact material. Metal wires 124 within interconnect layers 120 can be made, for example, of aluminum, copper, and/or any other suitable back-end-of-line (BEOL) metal materials. Metal wires 124 and/or contacts 128 in outermost interconnect layers 120 can be made of a metal material suitable for surface-to-surface bonding (e.g., copper). Metal wires 124 and contacts 128 may include any appropriate liner (not shown).

ICs typically include a number of test structures (also known as 'macros') that are used to test operation of the IC. The test structures may include any circuitry configured to test desired parameters of IC operation, e.g., performance, speed, longevity, etc. Explicit test structures are not shown in the drawings but may include a variety of transistors 116 in device layer 112 and other electrical components in other areas of the IC 100. As understood in the art, the test structures may be built within the chips in a wafer (see wafer 162 in FIG. 12) (i.e., within the body of the wafer) or in kerf(s) of the wafer (space between ICs). As will be described herein, a testing system 170 (FIG. 13) includes a number of test probes 182 (FIG. 13) that are brought into contact with contact pads 152 (FIGS. 9-11) that are operatively couple to the test structures within the IC, i.e., such that electrical signals passed through contact pads 152 from test probes 182 operates a test structure. Testing system 170 (FIG. 13) runs electrical test on the test structures.

Figure 3:
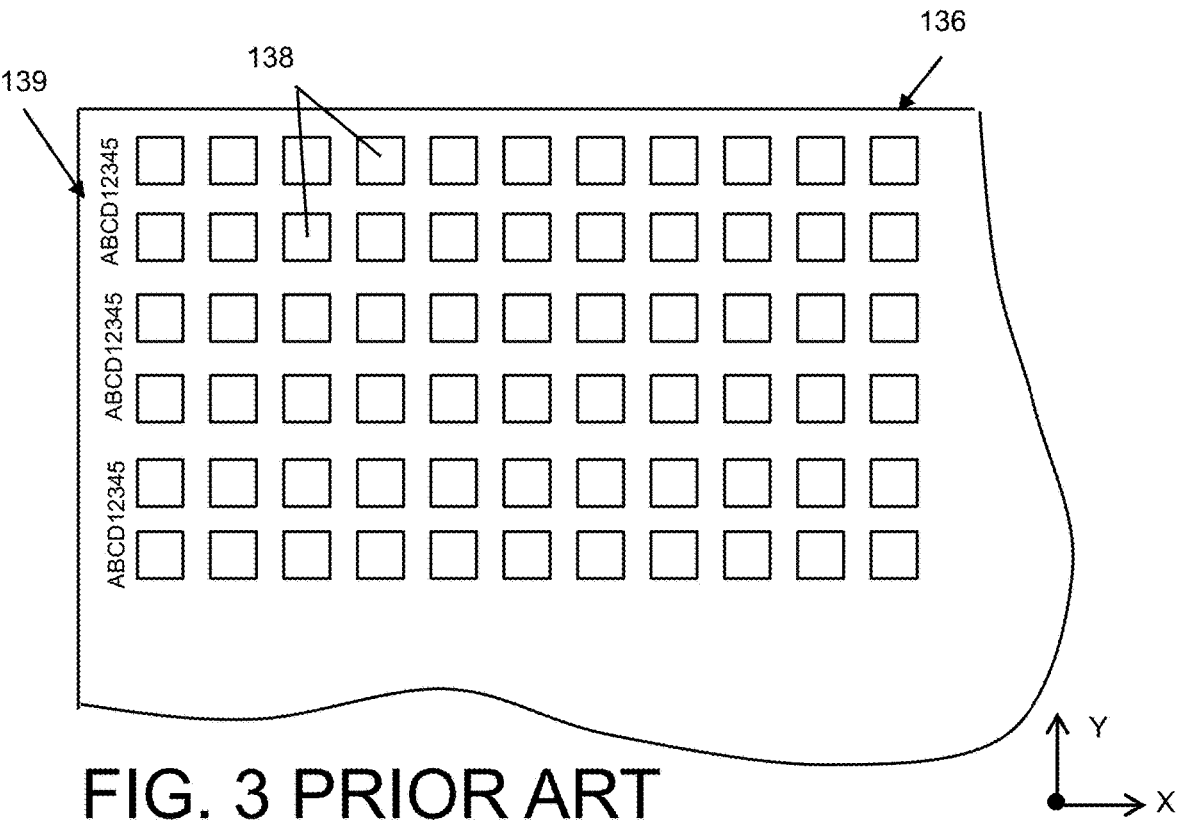
FIG. 3 shows an enlarged top-down view of a portion of a conventional IC.

FIG. 3 shows a portion of conventional IC 136 at which testing occurs. As noted, the actual test structures are within IC 136 (within the page) and contact pads 138 provide access to the test structures. In order to identify the test structures, alphanumeric labels 139 are provided on an exterior surface of IC 136. As noted, alphanumeric labels 139 are manually read by a user, e.g., using a magnifying system, and must be manually located by, for example, looking at maps and test structure names. The process is time consuming. Once the desired test structure is located, a user uses the alphanumeric label 139 to manually retrieve information about how to set up a testing system for testing IC 136. For example, the wafer upon which IC 136 exists needs to be manually or automatically aligned to the testing system, which is, in either case, challenging and time consuming.

Figure 13:
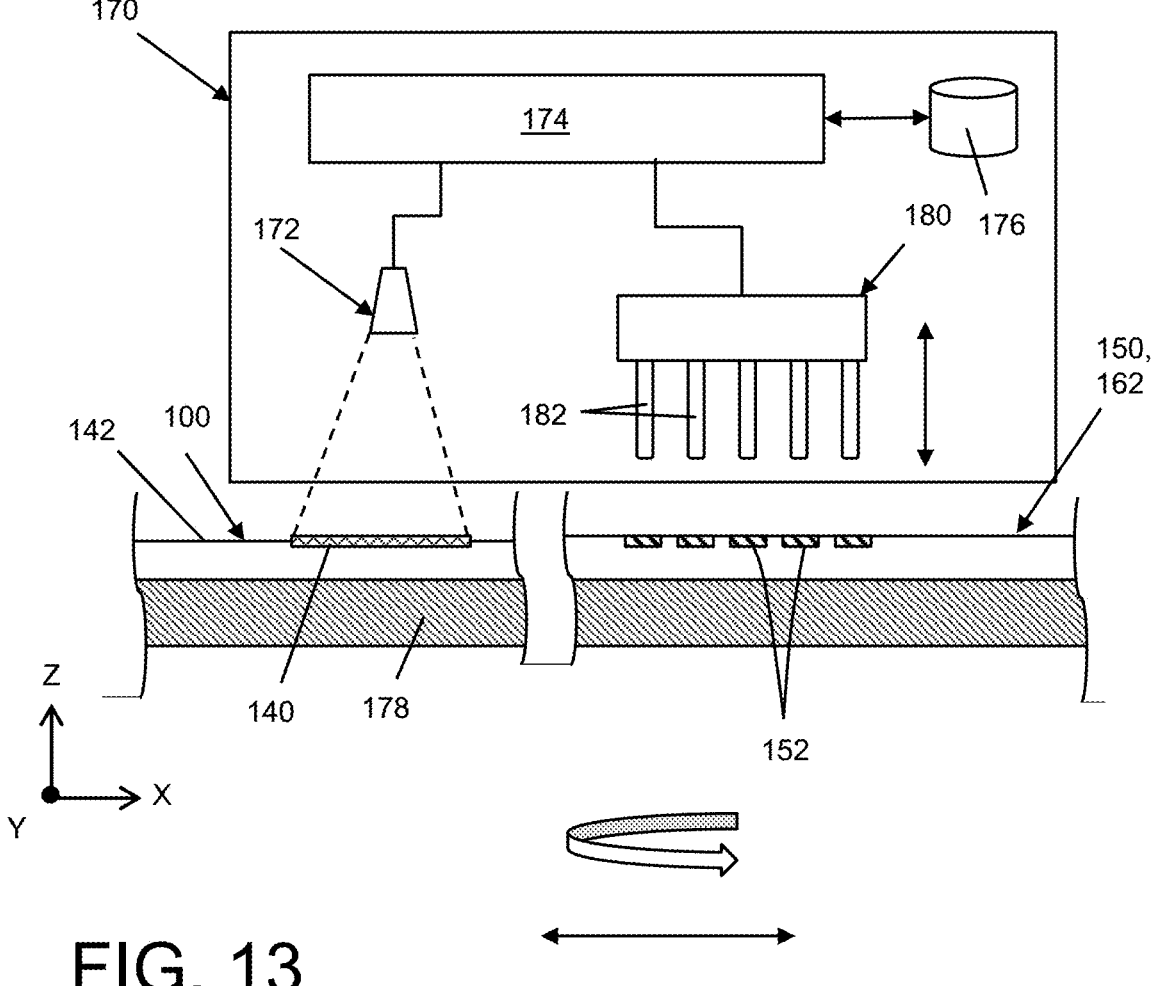
FIG. 13 shows a schematic view of a testing system configured to use a machine-readable code for testing an IC, according to embodiments of the disclosure.

In order to address these challenges, as shown in FIGS. 1-2, IC 100 also includes a machine-readable code 140 in a selected metal layer 142 of plurality of metal layers 122. Selected metal layer 142 may be any interconnect layer 120 in which machine-readable code 140 is readable by a scanner 172 (FIG. 13) of a testing system 170 (FIG. 13), i.e., code 140 has sufficient contrast to be readable by scanner 172 (FIG. 13) which is dependent on the scanner used. More particularly, it is recognized that ILD layers 130 are oftentimes made of a material, such as silicon oxide, which is transparent. Hence, selected metal layer 142 may be internal to an external surface of IC 100, and machine-readable code 140 is readable by scanner 172 (FIG. 13) through the external surface of IC 100. In FIG. 1, selected metal layer 142 is a last metal layer LM of plurality of metal layers 142, i.e., the last layer of interconnect layers 120 of IC 100 before chip packaging connections are present. In certain embodiments, selected metal layer 142 is within three metal layers of a last metal layer LM. In this setting, scanner 172 (FIG. 13) can read machine-readable code 140 through up to six ILD layers, i.e., three metal layers 122 and three corresponding via layers 126. In FIG. 2, selected metal layer 142 is metal layer Mn within three metal layers of last metal layer LM. (Last metal layer LM and intervening metal layers 122 are partially shown in phantom to indicate the number of layers may vary). In any event, machine-readable code 140 is embedded in the circuitry layers of IC 100—it is not on an external surface of IC 100. Machine-readable code 140 is in the same metal layer as electrically operative metal wires 124 of IC 100. Machine-readable code 140, however, is not coupled to any electrically operative metal wires 124 of IC 100. No other metal wires or contacts are over machine-readable code 140 to ensure its visibility to a scanner 172 (FIG. 13).

Machine-readable code 140 is made of the same metal as metal wires 124 in plurality of metal layers 122 and may include the same materials. Machine-readable code 140 may be any two-dimensional array of contrasting light and dark (e.g., white and black, or dark and transparent) structures (e.g., metal wire material and surrounding ILD material) that is used to provide easy access to other information stored elsewhere, e.g., database, Internet, etc., and is readable and interpretable by scanner 172 (FIG. 13). As will be described herein, scanner 172 (FIG. 13) may include any device capable of reading machine-readable code 140, e.g., a digital imaging device, camera, smartphone, etc., having a reader application. Machine-readable code 140 is not an alphanumeric label and is not human-readable.

Figures 4, 5, 6, 7, 8:
FIG. 4 shows a top-down view of a machine-readable code in the form of a quick response (QR) code, according to embodiments of the disclosure.
FIG. 5 shows a top-down view of a machine-readable code in the form of a QR code, according to other embodiments of the disclosure.
FIG. 6 shows a top-down view of a machine-readable code in the form of a micro QR code, according to embodiments of the disclosure.
FIG. 7 shows a top-down view of a machine-readable code in the form of a data matrix, according to embodiments of the disclosure.
FIG. 8 shows a top-down view of a machine-readable code in the form of a bar code, according to embodiments of the disclosure.

FIGS. 4-8 show top-down views of illustrative machine-readable codes 140. FIGS. 4 and 5 show variations of a quick response (QR) code. FIG. 4 shows a QR code with structured blocks, and FIG. 5 shows a QR code with structured blocks and dotted structures. FIG. 6 shows a micro-QR code, which has similar structure to a QR code, but may include less data than a QR code and may use less area. FIG. 7 shows a data matrix, and FIG. 8 shows a bar code. Machine-readable code 140 may have other forms not expressly disclosed herein.

Machine-readable code 140 may include any data to direct electrical testing of the IC 100 by a testing system 170 (FIG. 13), described herein. In certain embodiments, machine-readable code 140 includes an identifier that can be used to retrieve testing information from data storage 176, e.g., a database. The testing information can be any data regarding the testing such as but not limited to: location and type of test structures, coordinates of contact pads 152 (FIGS. 9-11), and test setup requirements. In certain embodiments, machine-readable code 140 may include data regarding at least one of product information and code identification information, i.e., beyond just an identifier to retrieve testing information. Product information may include a unique identifier such as the product name or the identification of the mask set used to manufacture it. Code identification information may provide an index or identifier that can be used to determine which machine-readable code 140 it is where multiple machine-readable codes 140 are placed in a single product.

Figure 9:
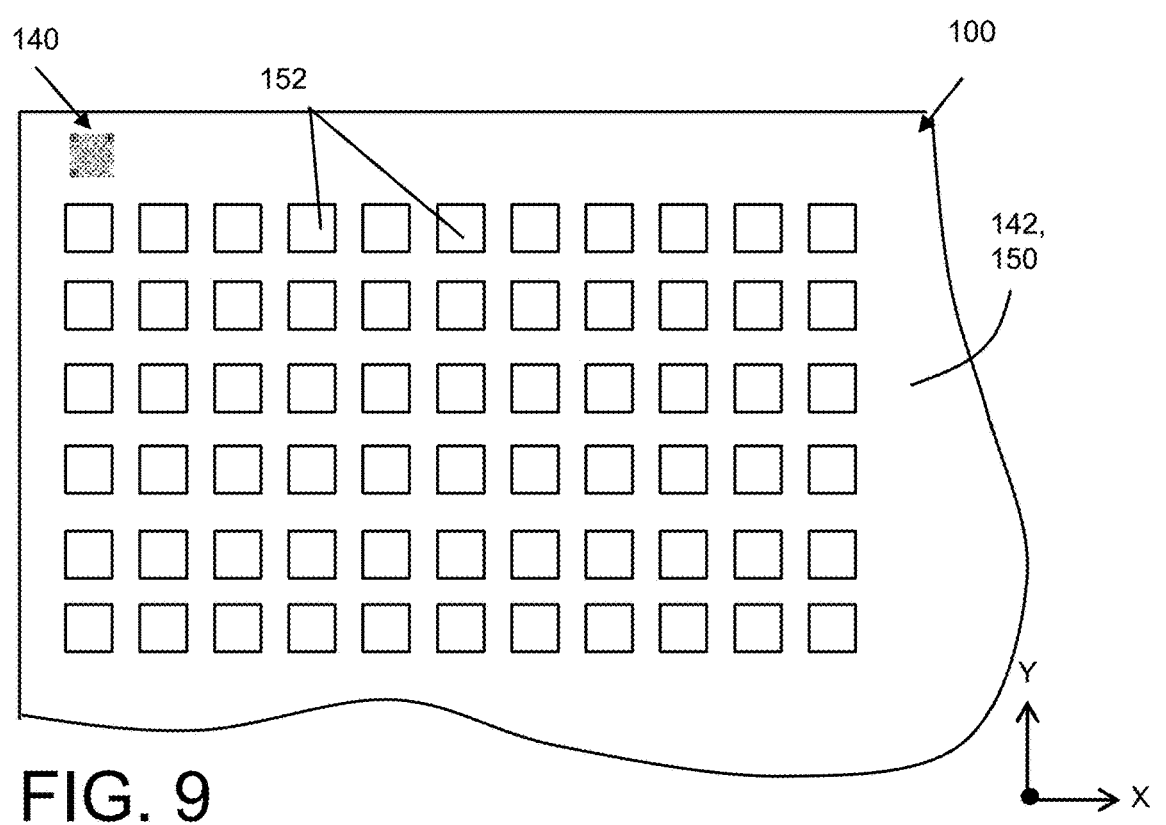
FIG. 9 shows an enlarged top-down view of a portion of an IC including a machine-readable code and contact pads to one or more test structures, according to embodiments of the disclosure.
Figure 10:
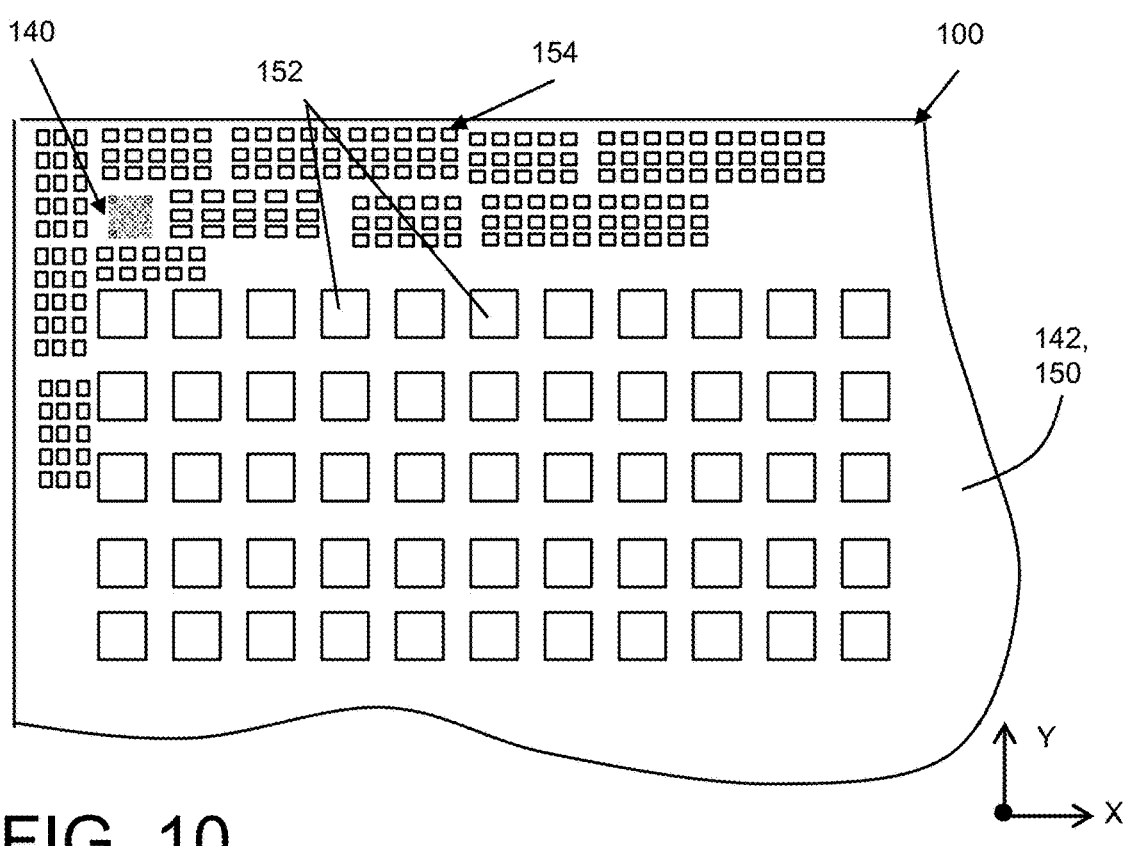
FIG. 10 shows an enlarged top-down view of a portion of an IC including a machine-readable code, contact pads to one or more test structures, and dummy fill shapes, according to other embodiments of the disclosure.
Figure 11:
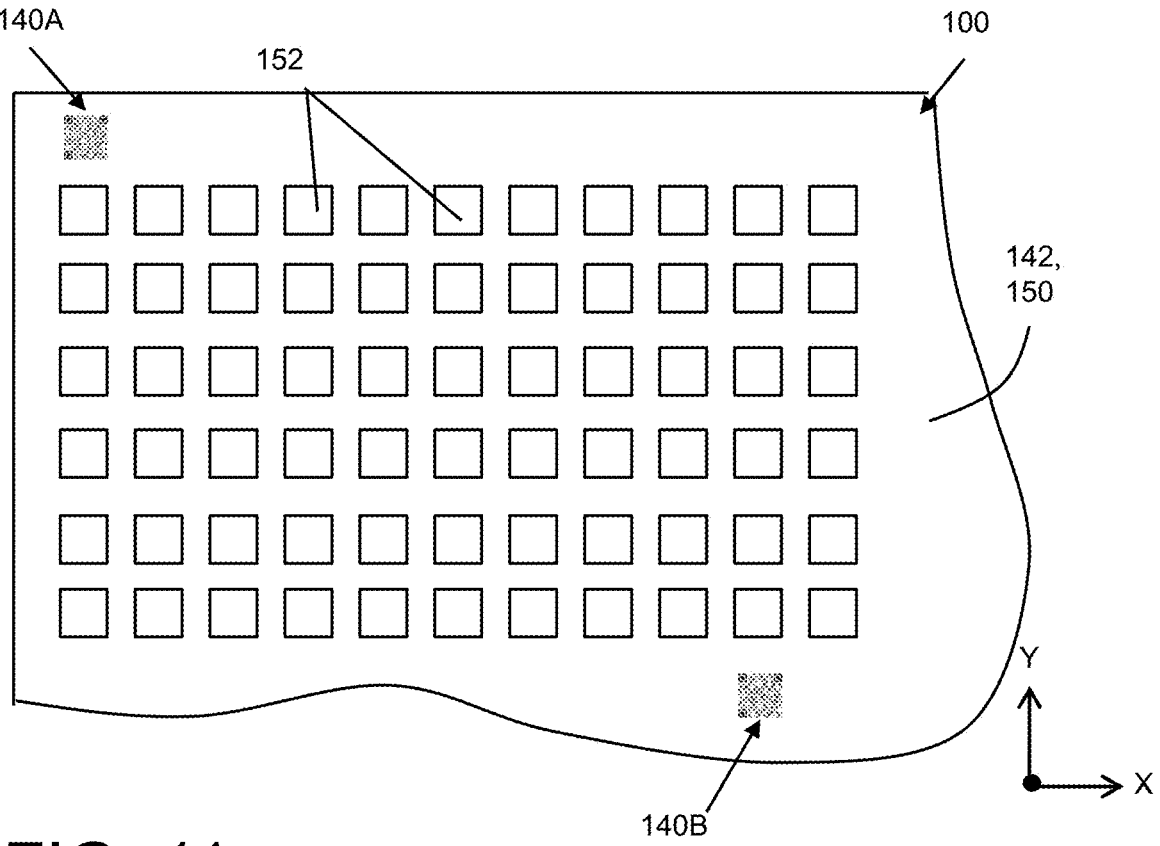
FIG. 11 shows an enlarged top-down view of a portion of an IC including two machine-readable codes and contact pads to one or more test structures, according to yet other embodiments of the disclosure.

FIGS. 9-11 show top-down views of IC 100 in a region 150 in which test structures are located in IC 100 (similar to FIG. 3). Region 150 may be in a kerf of a wafer 162 (FIG. 12), i.e., small line between ICs 100 on wafer 162 that is typically used to dice IC chips apart, or in a body of an IC

Figure 12:
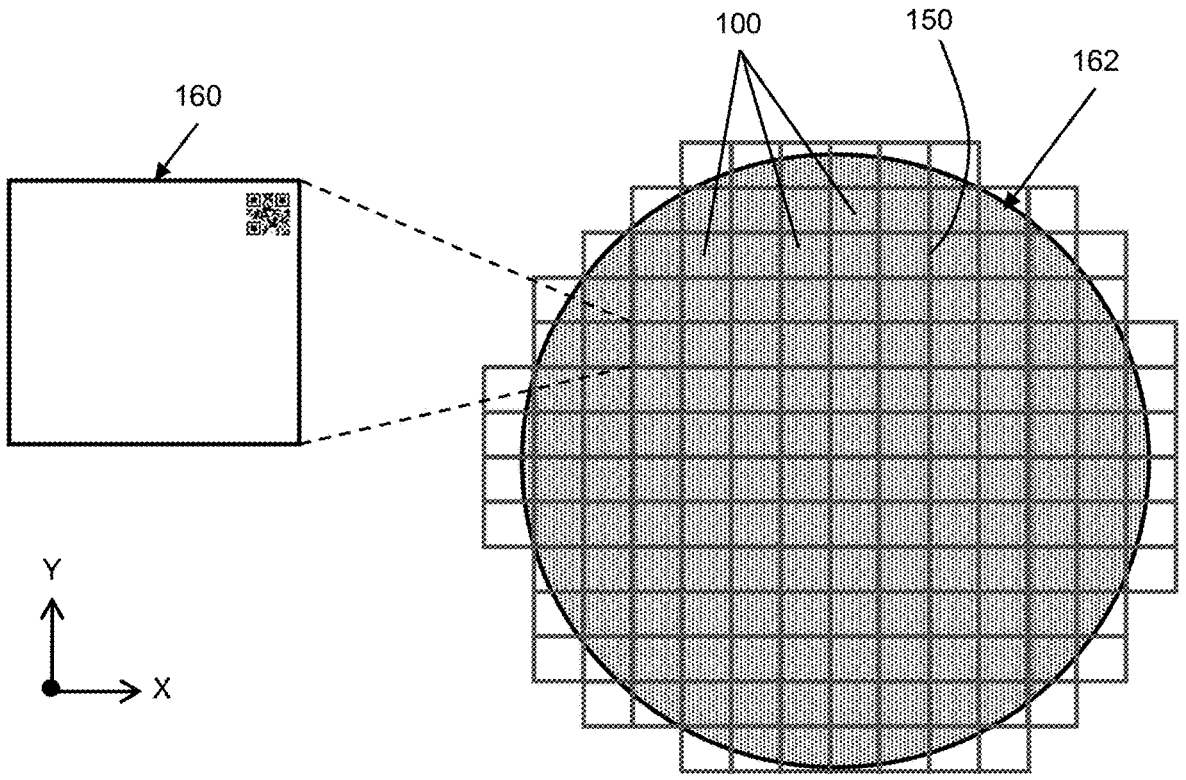
FIG. 12 shows a schematic view of a reticle and a wafer for a method, according to embodiments of the disclosure.

100 in wafer 162 (FIG. 12). As shown in FIG. 9, in certain embodiments, machine-readable code 140 may be adjacent a plurality of contact pads 152, which allow test probes 182 (FIG. 13) of testing system 170 (FIG. 13) to electrically couple to test structures within IC 100.

As shown in FIG. 10, in other embodiments, machine-readable code 140 may also be adjacent a plurality of dummy fill shapes 154. In the example shown, dummy fill shapes 154 are all around machine-readable code 140, but this is not necessary in all cases. As understood in the art, dummy fill shapes 154 are metal segments positioned in otherwise empty space of IC 100 to, for example, ensure proper formation of other structure and/or provide resistance against dishing of ILD layers 130 (FIGS. 1-2) that may occur during certain planarization steps.

FIG. 11 shows an embodiment in which a plurality of machine-readable codes 140A, 140B are used in selected metal layer 142. In certain embodiments, where more than one machine-readable code 140 are used, each code 140A, 140B may be mostly the same to provide redundancy and easy location thereof. In other embodiments, where more than one machine-readable code 140A, 140B are used, they may be different in terms of what testing information they indicate should be used, i.e., retrieved from data storage 176. In other embodiments, where more than one machine-readable code 140A, 140B are used, they may be different in terms of, for example, their code identification data that identifies the particular code and perhaps its respective location. The different code 140A, 140B location information can be used in a variety of ways, e.g., to locate required contact pads 152 or other codes or structures. Where more than one machine-readable code 140 are used, as described herein, each code 140A, 140B may be different in addition to just its location and may provide product information, e.g., a unique identifier such as the product name or the identification of the mask set used to manufacture it. While to machine-readable codes 140A, 140B are shown in FIG. 11, any number of machine-readable codes 140 may be used on an IC 100.

In certain embodiments, machine-readable code 140 also provides an area size benefit because they are significantly smaller than conventional alphanumeric labels 139 (FIG. 3). For example, in certain embodiments, machine-readable code 140 may have a maximum cross-sectional area of 4900 square micrometers ($\mu m^2$). For example, machine-readable code 140 may be 70 micrometers ($\mu m$) by 70 $\mu m$. In one non-limiting example, this cross-sectional area saves 1.8 square millimeters ($mm^2$) in a test site.

Figure 14:
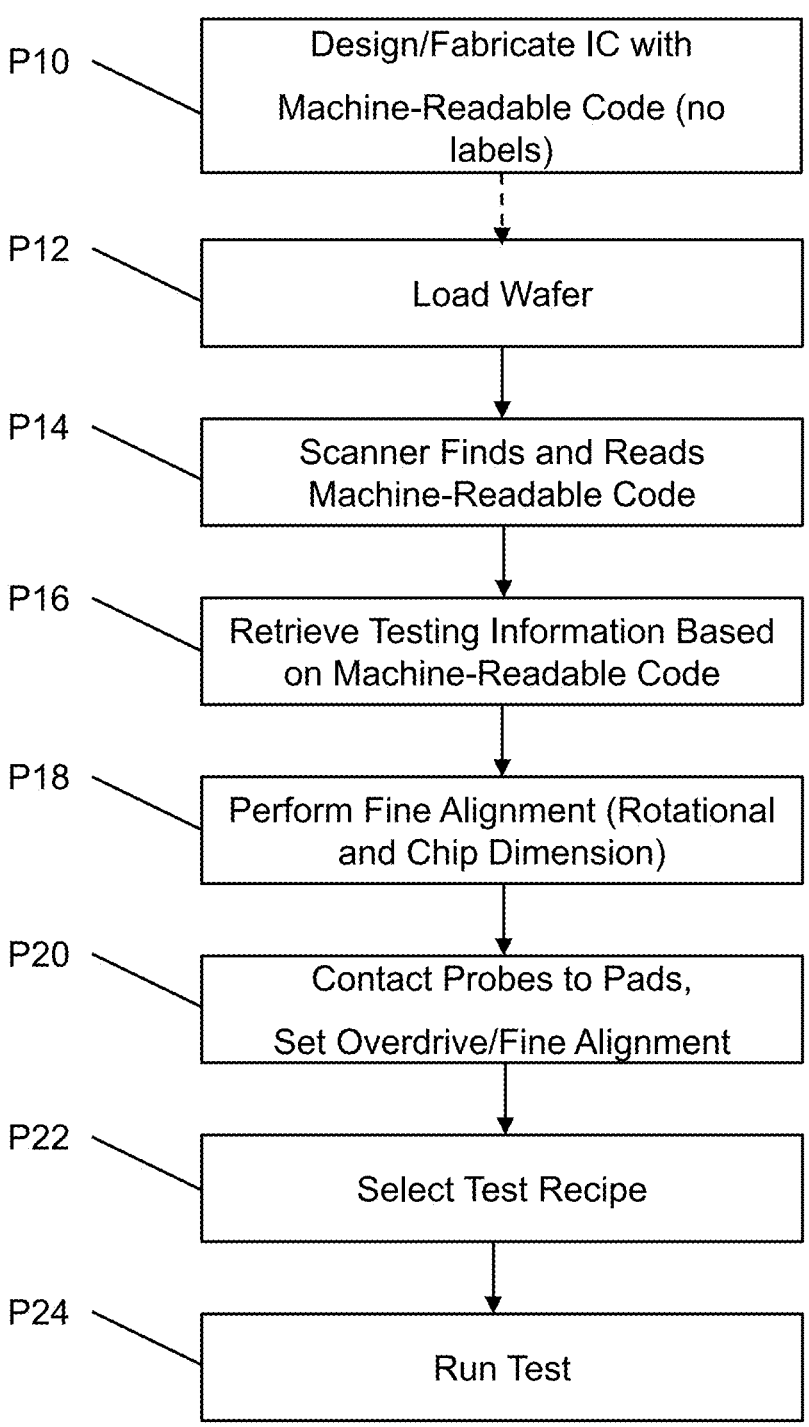
FIG. 14 shows a flow diagram of a method, according to embodiments of the disclosure.

FIG. 12 shows a schematic view of a reticle 160 and a wafer 162 formed using a method, according to embodiments of the disclosure. FIG. 13 shows a schematic view of a testing system 170 configured to use machine-readable code 140 for testing an IC 100, and FIG. 14 shows a flow diagram of a method, according to embodiments of the disclosure. Referring to FIG. 12, wafer 162 includes a plurality of ICs 100, as described herein. Reticle 160 is used to form selected metal layer 142 (FIGS. 1-2) of IC 100 in any now known or later developed fashion. As shown in FIG. 12, reticle 160 may be exposed in a stepped manner across wafer 162 to create ICs 100. Embodiments of a method according to the disclosure may include forming IC 100 including plurality of metal layers 122. This process is shown in FIG. 14 as process P10. IC 100 may be formed, e.g., designed and fabricated, using any now known or later developed design and fabrication techniques. IC 100 design processes may include any now known or later developed techniques that embed machine-readable code 140 as part of selected metal layer 142. In terms of fabrication, processes may include but are not limited to material deposition, photolithography (mask formation, e.g., using reticle 160; etching; and mask removal), doping and planarization. As noted, the method includes forming selected metal layer 142 (FIGS. 1-2) of IC 100 including machine-readable code 140 in metal in selected metal layer 142. The same reticle may be used for each IC 100 of wafer 162, or different reticles 160 may be used to create different machine-readable code 140 for different ICs 100 of wafer 162. Referring again to FIG. 10, forming selected metal layer 142 of IC 100 including machine-readable code 140 in metal in the selected metal layer 142 may also include forming more than one machine-readable code 140A-B in the metal in selected metal layer 142. Contact pads 152 (FIGS. 10-11) and dummy fill shapes 154 (FIG. 11) may be formed in any now known or later developed fashion. As the design and fabrication of ICs are otherwise well-known processes, no further details are provided so the reader can focus on the salient features of the disclosure.

As shown in FIGS. 13 and 14, a method according to embodiments of the disclosure may also include testing IC 100 using testing system 170. Testing system 170 may include any now known or later developed wafer testing system modified to use machine-readable code 140. In contrast to conventional systems, testing system 170 may include a scanner 172 configured to read machine-readable code 140 in selected metal layer 142 of IC 100 in wafer 162. As noted, scanner 172 may include any device capable of reading machine-readable code 140, e.g., a digital imaging device, camera, smartphone, etc., having a reader application. Scanner 172 may be moved manually or automatically using any appropriate actuators (not shown) controlled by controller 174 and/or a user. Testing system 170 may also include a controller 174 having logic modified to be configured to operate scanner 172 and use information retrieved from or based on machine-readable code 140. Testing system 170 may include data storage 176 operatively coupled to controller 174 for storing information that can be retrieved based on data acquired from machine-readable code 140. Note, FIG. 13 schematically shows a small portion of IC 100 and an even smaller part of wafer 162. As understood in the art, wafer 162 may include large numbers of ICs 100, e.g., greater than one hundred and perhaps more than a thousand ICs. As will be recognized, wafer 162 is positioned on a holder 178 (also referred to as a "chuck"), which can be rotated and moved in many directions (i.e., left-right on page (X-axis), into-out of the page (Y-axis), vertically on page (Z-axis), and rotated along any X, Y, Z axes) to position wafer 162 for testing under control of controller 174 of testing system 170. Holder 178 may include any now known or later developed actuators (not shown) to provide the necessary movement of wafer 162. Controller 174 may include any now known or later developed computerized control system.

Testing system 170 also includes a tester 180 configured to perform testing on IC 100 in wafer 162 based on testing information from or based on machine-readable code 140. Tester 180 may include any now known or later developed system for contacting electrical test probes 182 thereof to contact pads 152 on IC 100 for running test on test structures in IC 100. Any number of test probes 182 may be used. Tester 180 may include any now known or later developed actuators (not shown) to provide the necessary movement of test probes 182.

In process P12, wafer 162 is loaded into testing system 170. Wafer 162 may be loaded manually or automatically in any now known or later developed fashion, e.g., using a front opening unified pod (FOUP).

In process P14, scanner 172 finds and reads machine-readable code 140, and in process P16, controller 174 retrieves testing information based on machine-readable code 140. This code finding process can be performed in automated fashion with scanner 172 scanning over IC 100 until machine-readable code 140 is detected and read. This process removes the need for a user to manually find an alphanumeric label for a test structure and provides for automation of the testing process in a number of ways. Scanner 172 can be moved by controller 174 or a user in any desired pattern until machine-readable code 140 is identified. As noted, in certain embodiments, more than one redundant machine-readable code 140 may be provided for ease of locating.

The testing information may take any form. The testing information may include, for example, alignment information and product information. Alignment information may provide, for example, instructions to tester 180 and controller 174 how to position tester 180 relative to IC 100 and/or relative to contact pads 152 for a particular test structure in IC 100 (coordinates of contact pads 152). Product information may include any information regarding IC 100 such as but not limited to: model number, type of IC, types of test structures on the IC, type of tests to be run, test structures (macro) present on the IC, and/or reticle(s) used during manufacture.

The information contained on machine-readable code 140 and the testing information that can be automatically retrieved from data storage 176 based on machine-readable code 140 provides a significant number of automaton capabilities for testing system 170. For example, the method may include automatic aligning of tester 180 based on the alignment information. Notably, a location of machine-readable code 140 may be provided by code 140 and/or retrievable from data storage 176, such that once a code 140 is found and read, the location thereof on wafer 162 is automatically known. The location of machine-readable code 140 can be used as a reference for, for example, where contact pads 152 for a particular test structure are located-making it possible to automate tester 180 alignment. In another example, in addition to location information, machine-readable code 140 may include information that can be used to determine whether it is a single code or one of a sequence of codes on IC 100. Where it is a sequence of codes 140 on IC 100, the information can be used to direct tester 180 to a first test structure in a sequence of test structures that are to be tested, or to another machine-readable code 140 that may provide additional testing information about the sequence of testing. In any event, machine-readable code 140 can be used to retrieve a vast amount of testing information quickly and automatically, reducing the time of test setup and operation.

In process P18, the location information of machine-readable code 140 may be used to perform fine alignment of wafer 162, e.g., alignment of wafer in a rotational sense and fine alignment relative to a particular IC chip's dimensions. That is, the testing may include automatically aligning IC 100 for contact of contact pads 152 thereon by test probes 182. Controller 174 may be used to automatically adjust actuators of holder 178 to make the desired alignment movements or to automatically adjust actuators in tester 180 to make the desired alignment movements.

In process P20, test probes 182 of tester 180 are brought into contact with contact pads 152 of a desired test structure (see double head arrow) in IC 100. A user may provide any desired fine alignment and overdrive to tester 180. 'Over-drive' is a fine adjustment of vertical force applied by test probes 182.

In process P22, a test recipe is selected. A test recipe is a sequence of electrical signals to be applied to a particular test structure via tester 180 and under control of controller 174. This process may be automated based on testing information retrieved based on machine-readable code 140, or a user may manually select the test recipe, e.g., from a list provided by controller 174.

In process P24, testing of IC 100 is performed by testing system 170. The testing can be carried out in any now known or later developed fashion.

Embodiments of the disclosure provide various technical and commercial advantages, examples of which are dis-cussed herein. Machine-readable code 140 embedded in circuitry of IC 100 reduces test setup effort and time by automating a number of processes. The code also eliminates the challenges of manually reading alphanumeric labels, which may be illegible. The machine-readable code 140 also reduces areal space required for providing testing informa-tion on IC 100, allowing that space to be used for IC products.

For purposes of this disclosure, a semiconductor material refers to a material whose conducting properties can be altered by doping with an impurity. Such semiconductor materials include, for example, silicon-based semiconductor materials (e.g., silicon, silicon germanium, silicon germa-nium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor mate-rial) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conduc-tivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conduc-tivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer;

whereas, when a semiconductor region or layer is described as being at a lower conductivity level than another semi-conductor region or layer, it is less conductive (more resis-tive) than that other semiconductor region or layer.

The structure and method as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a moth-erboard, or (b) an end product. The end product can be any product that includes integrated circuit chips, ranging from toys and other low-end applications to advanced computer products having a display, a keyboard or other input device, and a central processor.

The terminology used herein is for the purpose of describ-ing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, ele-ments, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary with-out resulting in a change in the basic function to which it is related. Accordingly, a value modified by a term or terms, such as "about", "approximately" and "substantially", are not to be limited to the precise value specified. In at least some instances, the approximating language may corre-spond to the precision of an instrument for measuring the value. Here and throughout the specification and claims, range limitations may be combined and/or interchanged, such ranges are identified and include all the sub-ranges contained therein unless context or language indicates oth-erwise. "Approximately" as applied to a particular value of a range applies to both values, and unless otherwise depen-dent on the precision of the instrument measuring the value, may indicate +/−10% of the stated value(s).

The corresponding structures, materials, acts, and equiva-lents of all means or step plus function elements in the claims below are intended to include any structure, material, or act for performing the function in combination with other claimed elements as specifically claimed. The description of the present disclosure has been presented for purposes of illustration and description but is not intended to be exhaus-tive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC), comprising:
a plurality of metal layers;
a machine-readable code in a selected metal layer of the plurality of metal layers; and
dummy fill shapes surrounding the machine-readable code.

2. The IC according to claim 1, wherein the machine-readable code includes one of a quick response (QR) code, a micro-QR code, a bar code and a data matrix.

3. The IC according to claim 1, wherein the machine-readable code includes data to direct an electrical test of the IC by a testing system.

4. The IC according to claim 1, wherein the machine-readable code includes data regarding at least one of product information and code identification information.

5. The IC according to claim 1, wherein the machine-readable code includes a plurality of machine-readable codes in the selected metal layer.

6. The IC according to claim 1, wherein the selected metal layer is within three metal layers of a last metal layer.

7. The IC according to claim 1, wherein the selected metal layer is a last metal layer of the IC.

8. The IC according to claim 1, wherein the selected metal layer is internal to an external surface of the IC, and the machine-readable code is readable by a scanner through the external surface of the IC.

9. The IC according to claim 1, wherein the machine-readable code has a maximum cross-sectional area of 4900 square micrometers.

10. The IC according to claim 1, further comprising a plurality of contact pads in the selected metal layer adjacent to the machine-readable code, the plurality of contact pads operatively coupled to at least one test structure.

11. A wafer comprising a plurality of ICs according to claim 1.

12. An integrated circuit (IC) wafer testing system, comprising:
a scanner configured to read a machine-readable code in a metal layer of an integrated circuit in a wafer; and a tester configured to perform testing on the IC in the wafer based on testing information obtained from storage based on the machine-readable code, wherein the tester automatically aligns the IC for contact of a plurality of contact pads thereon by a test probe.

13. The IC wafer testing system according to claim 12, wherein the testing information includes alignment information and product information.

14. A method, comprising:
forming an integrated circuit (IC) including a plurality of metal layers; and
forming a selected metal layer of the IC including a machine-readable code in metal in the selected metal layer; and
forming dummy fill shapes in the metal layer, wherein the dunny fill shapes surround the machine-readable code.

15. The method according to claim 14, further comprising testing the IC using a testing system including:
a scanner configured to read the machine-readable code in the selected metal layer of the IC in a wafer; and
a tester configured to perform testing on the IC in the wafer based on testing information obtained from storage based on the machine-readable code.

16. The method according to claim 15, wherein the testing information includes alignment information and product information, and further comprising aligning the tester based on the alignment information.

17. The method according to claim 15, wherein the testing includes automatically aligning the IC for contact of a plurality of contact pads thereon by a test probe.

18. The method according to claim 15, wherein forming the selected metal layer of the IC including the machine-readable code in metal in the selected metal layer includes forming more than one machine-readable code in the metal in the selected metal layer.

19. The method according to claim 14, further comprising forming a plurality of contact pads in the selected metal layer adjacent to the machine-readable code, wherein the plurality of contact pads are configured for operative coupling to at least one test structure.

20. The method according to claim 14, wherein the selected metal layer is within three metal layers of a last metal layer.

* * * * *